United States Patent [19]

Auzel

[11] Patent Number: 5,052,007
[45] Date of Patent: Sep. 24, 1991

[54] WAVELENGTH-STABILIZED SEMICONDUCTOR LASER

[75] Inventor: Francois Auzel, Le Mesnil St. Denis, France

[73] Assignee: French State, represented by the Minister of Post, Telecommunications, Le Mesnil St. Denis, France

[21] Appl. No.: 530,789

[22] Filed: May 30, 1990

[30] Foreign Application Priority Data

Jun. 8, 1989 [FR] France ............................. 89 07595

[51] Int. Cl.$^5$ ................................................ H01S 3/19
[52] U.S. Cl. ......................................... 372/45; 372/29; 372/32
[58] Field of Search ...................... 372/45, 19, 29–32, 372/107

[56] References Cited

U.S. PATENT DOCUMENTS

| | | | | |
|---|---|---|---|---|
| 3,774,120 | 12/1973 | Ross | ................................... | 331/94.5 |
| 4,573,156 | 2/1986 | Anthony et al. | ....................... | 372/19 |
| 4,737,960 | 4/1988 | Tsang | ................................... | 372/45 |
| 4,785,462 | 11/1988 | Keil | ...................................... | 372/19 |
| 4,787,086 | 11/1988 | Dentai et al. | ......................... | 372/19 |

OTHER PUBLICATIONS

Paoli et al., "Single longitudinal mode operation of cw junction laser by frequency-selective optical feedback," Appl. Phys. Lett., vol. 25, No. 12, Dec. 15, 1974, pp. 744–746.

Applied Physics Letters, vol. 49, No. 25, 12/11/86, W. T. Tsang et al., Observation of Enhanced Single Longitudinal Mode Operation, etc.

Applied Physics Letters, vol. 50, No. 22, 6/1/87, G. Eisenstein et al., High-Power Extended-Cavity Laser, etc.

*Primary Examiner*—Georgia Epps
*Attorney, Agent, or Firm*—Finnegan, Henderson, Farabow, Garrett & Dunner

[57] ABSTRACT

Wavelength-stabilized semiconductor laser in which a crystal (20) doped with rare earth ions is disposed in the cavity of the laser between the amplifier medium (10) and a mirror (22). Transmission is effected on a transition of the rare earth ion.

11 Claims, 2 Drawing Sheets

WAVELENGTH-STABILIZED SEMICONDUCTOR LASER

FIELD OF THE INVENTION

This invention relates to a a wavelength-stabilized semiconductor laser.

BACKGROUND OF THE INVENTION

This invention is applicable to the field of optical telecommunications and can be applied to all semiconductor lasers and in particular to lasers with an alloy III-V single or double heterostructure. For example, this may involve, but not exclusively, GaAs, GaAlAs, InGaAs, GaAsP, InGaAsP, InP lasers, etc.

Within the field of optical telecommunications, there currently exists a need to obtain laser sources offering extremely good frequency stability. It is only via this condition that it is possible to implement radioelectricity techniques, such as modulation, demodulation, etc.

The frequency stabilization of lasers in general and semiconductor lasers in particular is a technique widely known in current applications. Several solutions have been proposed: automatic ocntrol of the frequency at a resonannce mode of a Fabry-Pérot standard or at an absorption line of a gas, synchronization on another laser with the latter being stabilized, etc.

So as to render it easier to obtain this stability, the laser to be stabilized is selected or modified so as to already possess a certain frequency stability. It is thus possible to operate by sorting double heterostructures so as to only retain those components whose alloy makes it possible to obtain the desired central frequency; it is also possible to reduce the actual transmission width by extending the resonant cavity by means of an external auxiliary mirror (optical counter-reaction); finally, it is possible to resort to a diffraction grid disposed along the active zone (known as a "Distributed Feed-Back or "DFB" laser or as a "Distributed Bragg Reflection" or DBR" laser).

This state of the art is described, for example, in the article of Motoichi OHTSU and entitled "Frequency Stabilization in Semiconductor Lasers" published in the "Optical and Quantum Electronics" journal, vol. 20, (1988), pages 283-300.

However, these known techniques have a certain number of drawbacks. The method for sorting heterostructures results in low production yields. Resorting to the external mirror optical counter-reaction poses difficult mechanical problems and results in having structures which are complex and heavy to use. As regards lasers with grids distributed along the active zone, these may only be obtained at the price of significantly complicating production methods due to epitaxy reruns.

SUMMARY OF THE INVENTION

The object of the present invention is to overcome all these drawbacks. To this end, it proposes a stabilization device extremely simple to implement and which avoids all the problems involved in the prior art.

According to the invention, a crystal doped with rare earth ions is added to the cavity of the laser to be stabilized. It ought to be mentioned that as regards this subject, such ions possess one normal energy level state and one first excited electronic state. Owing to the fact of the electric field created by the crystalline network, these levels are decomposed into sub-levels (Stark effect). The ions then have series of absorption lines corresponding to transitions of the normal energy level state towards the excited state and emission lines corresponding to inverse transitions. These two series of lines are slightly offset with respect to each other, the emission lines occuring with slightly less energy and thus with a slightly larger wavelength.

Rare earths have already been used in seminconductor lasers. The article by W. T. TSANG and el and entitled "Observation of enhanced single longitudinal mode of operation in 1.5 $\mu$m GaInAsP erbium-doped semiconductor injection lasers" published in the journal "Applied Physics Letters", vol. 49 (25), 22 December 1986, pp. 1686-1688, describes a technique consisting of introducing the rare earth ions into the active zone of the laser.

In actual fact, such a method leads to difficulties. First of all, it is difficult to introduce rare earths into the semiconductors (maximum concentration of about $10^{16}$ – $10^{18}$ cm$^{-3}$), as these have a tendency to precipitate there. In fact, a random multiple cavity is obtained, which clearly provides a monofrequency functioning, but with an unpredictable frequency. In addition, the temperature instability observed by the authors, that is W. T. TSANG and al, remains high: $\partial \lambda / \partial T = 1.1$ Å/°C., which clearly shows that it is not the rare earth ions which stabilize the emission as the actual instability of these ions is much lower and about $10^{-2}$ Å/°C.

The inventor of the present invention has clearly shown (in an article published in the journal "Applied Physics Letters", vol. 66, 3952, 1989) that the rare earth ions only re-enter the semiconductor in a low concentration (case of Yb$^{3+}$) or remaining outside the latter (case of Er$^{3+}$), the gains obtained at the frequency of the rare earth transition being negligible ($10^{-1}$ to $10^{-2}$ cm$^{-1}$) compared with those of the semiconductor (about $10^2$ cm$^{-1}$).

This gain is therefore scarcely modified by adding rare earth ions.

An article by VAN DER ZIEL published in the journal "Applied Physics Letters", vol. 50, 1313, 1987 confirmed that it was necessary to question to interpretations firstly given in the article of W. T. TSANG.

The present invention is able to overcome all these drawbacks. It makes it possible to use rare earth ion concentrations much greater than those used in the prior art ($10^{20}$ to $10^{22}$ cm$^{-3}$), which considerably modifies the gain of the semiconductor and actually benefits the transition of the rare earth ion with high wavelength stability (instability of about $10^{-2}$ Å/°C.).

This result is obtained by means of the invention by using a crystal doped with rare earth ions disposed outside the semiconductor. The rare earth ions are thus no longer situated in the active semiconductor medium.

According to the invention, the composition of the crystal and the nature of the ions are selected so that one of the rare earth transitions (absorption and/or emission) falls into the spontaneous emission band of the semiconductor amplifier medium. There then occurs a transfer of energy from the shortest wavelengths to the largest wavelengths, as shall be more readily understood later. The transition of the rare earth ion is to be overriding and it is on the wavelength of this transition that the laser shall oscillate.

More precisely, the object of the present invention is to embody a semiconductor laser including an amplifier medium with a semiconductive junction and at least one mirror, the junction being combined with a current source and having a spontaneous emission band, this laser being characterized by the fact that, so as to wavelength-stabilize it, it further includes a crystal doped with rare earth ions having a transition falling within the spontaneous emission band of the amplifier medium, this crystal being disposed between the mirror and the amplifier medium, the laser then emitting on a wavelength corresponding to the transition of the rare earth ion.

The value of the stabilized wavelength depends firstly on the rare earth ion used and to a smaller extent on the crystalline network which imposes an electric field on the ions, thus moving the levels via the Stark effect. The intensity of the crystalline field may thus vary by more than one factor 3 between $NdCl_3$ and $Y_3Al_5O_{12}$: Nd for example.

Thus, as regards the rare earth ion, it is possible to use:
$Sm^{2+}$ for a wavelength of between 0.65 $\mu$m and 0.7 $\mu$m,
$Nd^{3+}$, $Yb^{3+}$ for a wavelength of between 0.81 $\mu$m and 1 $\mu$m,
$Tm^{2+}$ for a wavelength close to 1.2 $\mu$m,
$Er^{3+}$ for a wavelength close to 1.5 $\mu$m,
$Tm^{3+}$, $Ho^{3+}$ for a wavelength close to 2 $\mu$m.

As regards the crystal, a wide variety of materials is available, including $Y_3Al_5O_{12}$, $LaCl_3$, $LaF_3$, $LaP_5O_{14}$, $CaWO_4$, $LiYF_4$, $Na_5La(WO_4)_4$, $LiLaP_4O_{12}$, $KLaP_4O_{12}$, etc.

The properties of crystals doped with rare earth ions are studied in depth in an article by F. AUZEL, the inventor of the present invention, this article being entitled "A Scalar Crystal Field Parameter for Rare Earth Ions; Meaning and Application to Energy Transfer" published in the volume entitled "Energy Transfer Processes in Condensed Matter" published by B. Di BARTOLO (PLENNUM), 1984.

According to another advantageous disposition of the invention, the crystal is given a form so that it produces a mode selection. By giving the stabilizer crystal the form of a thin section suitable for playing the role of the Fabry-Pérot standard, this standard shall only be able to have a single longitudinal mode of the atomic line. In other words, the free spectral interval, conventionally given by the formula c/2nL where c is the speed of the light, n the index of the crystal and L the thickness of the section, needs to be close to or more than the width $\hat{U} F$ of the emission line of the rare earth ion.

Thus, it is essential to try to take a thickness L of more than or equal to $c/2n\hat{U}F$.

For $n=1.5$, $\hat{U} F=1$ cm$^{-1}$, a thickness L of 1 mm is obtained.

According to another advantageous disposition of the invention, several crystals with a different composition are used doped with the same rare earth. For those reasons mentioned above, several overriding wavelengths shall be obtained. The laser shall then be a wave multilength and find an application in optical multiplexing.

BRIEF DESCRIPTION OF THE DRAWINGS

The characteristics of the invention shall appear more readily from a reading of the following description. This description concerns non-restrictive examples, reference being made to the accompanying drawings in which.

DETAILED DESCRIPTION OF THE PREFERRED EMBODIMENTS

Figure 1:
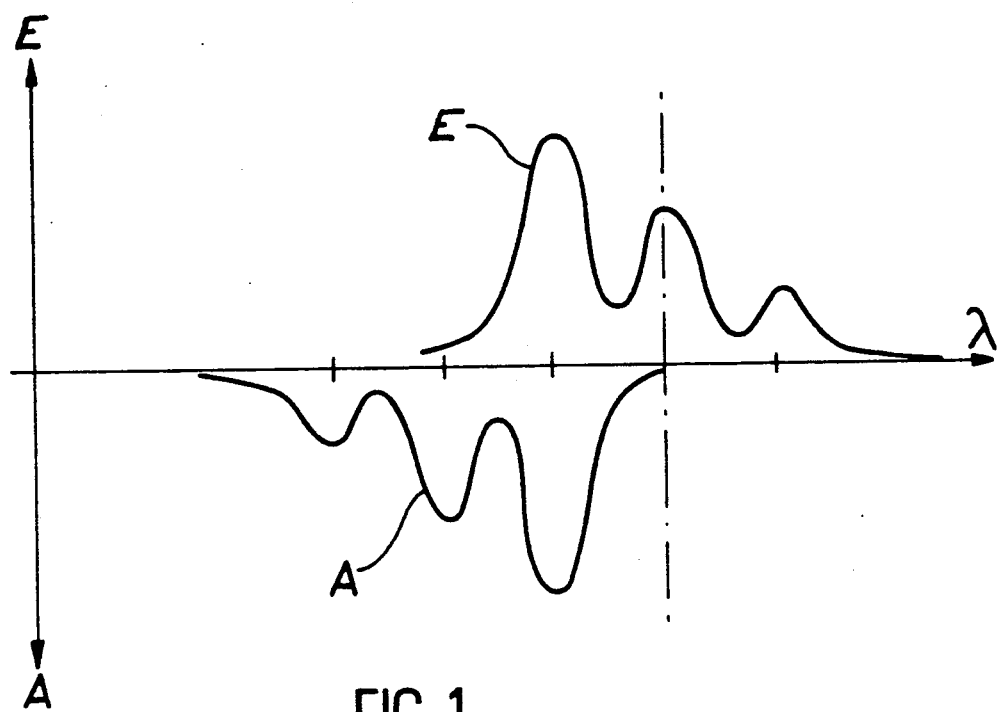
FIG. 1 diagrammatically shows an absorption-emission spectrum of a rare earth ion in a crystal.

FIG. 1 diagrammatically represents an absorption spectrum (A) of a crystal doped with rare earth ions and the emission spectrum (E). The axis of abscisses corresponds to the wavelength. The absorption peaks correspond to the various atomic transitions from the normal energy level state (separated by the Stark effect) to the first excited electronic state (also separated by the Stark effect) and the emission peaks correspond to the transitions from the excited state to the normal energy level state. Offsetting towards the large wavelengths of the emission with respect to absorption is conventional (Stokes effect).

Figure 2:
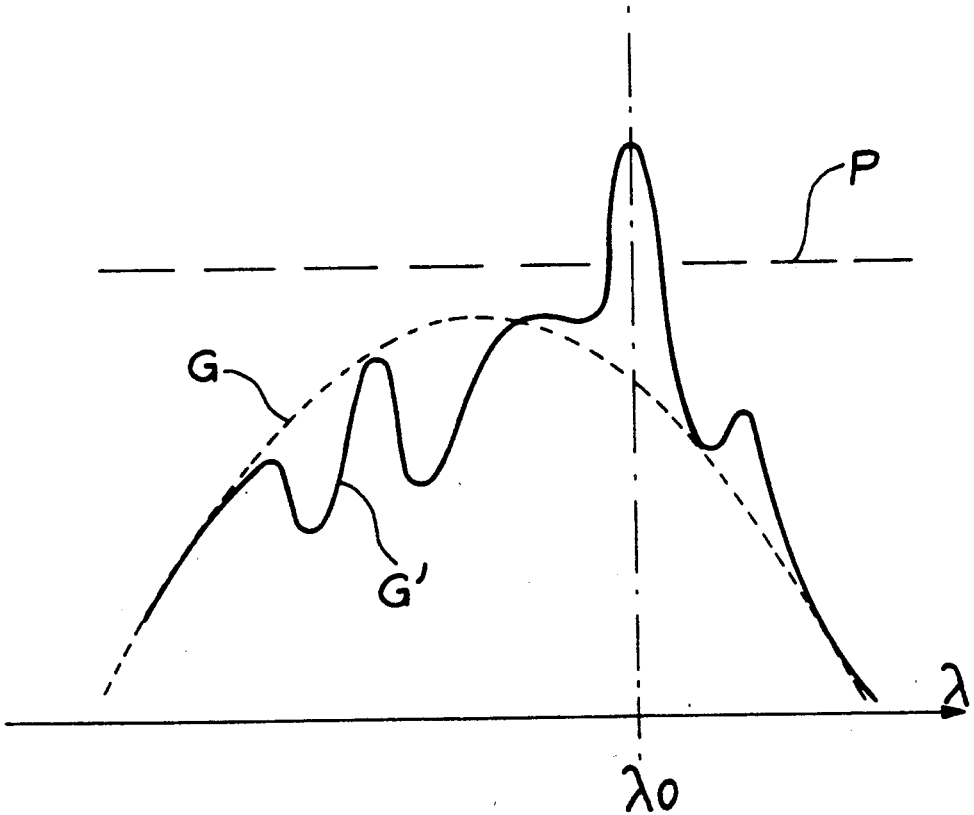
FIG. 2 shows the gain curve of a semiconductive amplifier medium and that of a composite unit including a semiconductive amplifier and a doped stabilizer crystal.

Thus, a doped crystal placed in the cavity of a laser shall modify the gain of the amplifier medium according to the diagram of FIG. 2. The gain curve G represents the variations of the gain according to the wavelength for a conventional semiconductive amplifier medium. The presence of the doped crystal reduces the gain in the absorption zone and increases it in the emission zone so as to give a curve G' which is generally below the curve G for the low wavelengths and above G for the higher wavelengths.

If the resonator has losses P, oscillation shall only be possible for the wavelength where the gain prevails over these losses. The oscillation shall thus occur at the wavelength λo, which is no longer defined by the top of the gain curve of the semiconductor amplifier medium, along with all the fluctuations possibly resulting from this, but by the emission line proper to the rare earth ion with the stability expected with atomic lines.

The invention is not limited to functioning on one emission line, such as the line λo represented, but extends to the case of any transition of the rare earth ion. At a low excitation level, even the "negative" part of the gain curve may be used to stabilize the laser.

Figure 3:
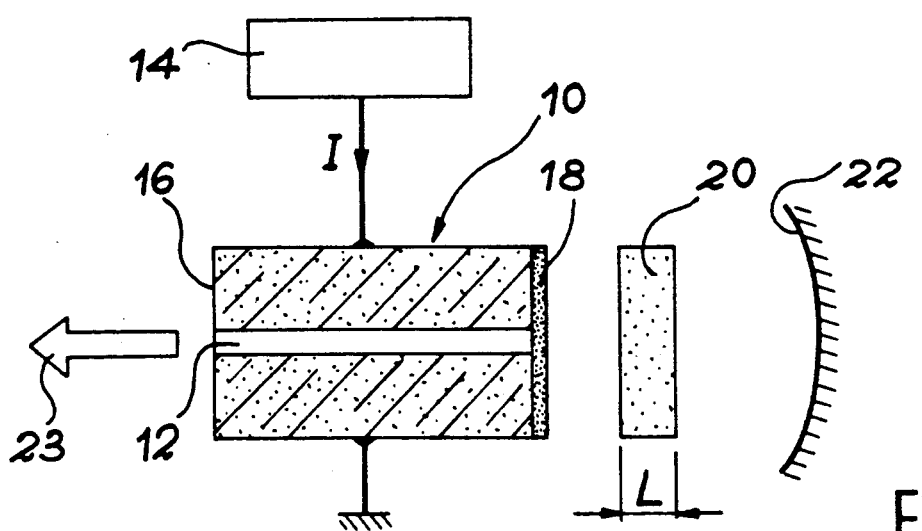
FIG. 3 illustrates a first embodiment of a laser conforming to the invention.
Figure 4:
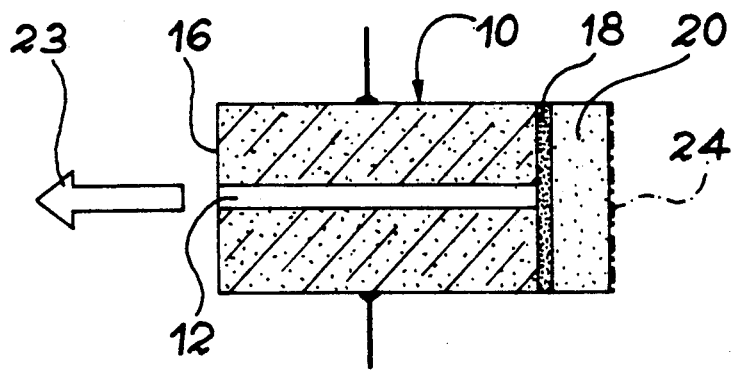
FIG. 4 illustrates a second embodiment of a laser conforming to the invention.
Figure 5:
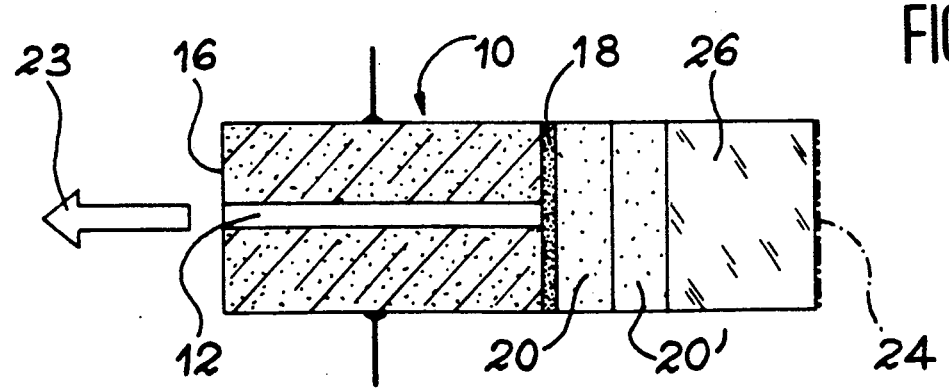
FIG. 5 illustrates a third embodiment of a laser conforming to the invention.

FIGS. 3 to 5 show several embodiments of lasers conforming to the invention.

The laser illustrated in FIG. 3 includes an amplifier medium 10 with a double heterostructure form and the junction PN referenced 12. The semiconductive structure is power-fed by a source 14. The front face 16 of the heterostructure is split. The rear face is covered with a coated film 18 and a thin crystalline doped plate 20 is located between film 18 and a spherical mirror 22. The coherent wavelength-stabilized emission is effected via the front (reference 23).

In a more compact variant illustrated by FIG. 4, the thin crystalline doped plate 20 is clad against the coated film 18 and a reflecting film 24 is deposited on the rear face of the plate.

The variant illustrated in FIG. 5 differs from the preceding ones by the use of an optical fiber 26 disposed between the crystalline plate 20 and the reflecting film 24. Advantageously, this fiber is self-focussing. This figure further shows a second plate 20' made of a crystal different from that of the plate 20 but doped by the same ions.

By way of example in no way restrictive, there now follows a description of a laser conforming to the invention and emitting on a single longitudinal mode ("monomode" or "monofrequency") stabilized at 1.5335 μm.

The amplifier medium is constituted by a quaternary alloy double heterostructure whose active zone is in InGaAsP. The natural emission of such a structure occurs between 1.480 and 1.525 μm according to the composition. The structure is stabilized by a crystal of LiYF$_4$ doped with erbium and having the formula LiY$_{1-x}$Er$_x$F$_4$ where x is between $10^{-4}$ and 1. The value of x depends on both the power available in the cavity, the thickness of the crystalline plate and the ions concentration Er$^{3+}$. The higher the power is, the more x is able to deviate from the unit and the thinner the thickness of the crystal becomes, if desired.

More precisely, in the case of a uniform absorption in the stabilizer crystal, there is the following approximate relation:

$$\phi LN > \frac{1}{2T} \frac{hF}{sr}$$

where:
T denotes the period of life of the excited level of the rare earth and is taken as equal to 10 ms,
F is the frequency, namely $2 \times 10^{14}$ s$^{-1}$ for a wavelength of 1.54 μm,
s is the effective absorption section and is taken as equal to $10^{-20}$ cm$^{-2}$,
$\phi$ is the optical flux impinging on the crystal in Wcm$^{-2}$,
N is the density of ions,
L is the thickness of the stabilizer crystal,
h is the Planck's constant,
r is the quantum yield which may be taken as equal to the unit.

The second member of the inequality is therefore approximately equal to $6.6 \times 10^{22}$ (Wcm$^{-4}$).

a) By taking x=1, N=$1.4 \times 10^{22}$ cm$^{-3}$; accordingly, L shall be more than 5 Wcm$^{-1}$.

For a laser having a power of 5 mW in the cavity with an active zone of 50 μm×0.1 μm, namely $5.10^{-8}$ (μm)$^2$, the flux shall be $10^5$ W/cm$^2$. The thickness L of the crystal shall thus be greater than $5.10^{-5}$ cm, namely of more than one half micrometer.

This example shows that if the stabilizer crystal has a high rare earth ions concentration, it may be extremely thin (0.5 μm) and constituted, for example, by a film disposed on the coating face of the heterostructure. But the quality of the material thus deposited leaves a lot to be desired and the quantum yield reduces.

Consequently, it is possible to prefer to select a smaller ions concentration (x less than 1).

b) At the other end of the range offered to x, it is possible to select x=0.001, which corresponds to N=$1.4 \times 10^{19}$ cm$^{-3}$ and, with the same hypotheses concerning the power, the thickness L shall then be more than 100 μm.

If the luminous flux corresponds to a power 10 times smaller, the thickness L becomes at least equal to 1000 μm.

If it is simultaneously desired for the crystalline plate to act as a longitudinal mode selector, it would be advisable to not give it a thickness of more than the value which gives at the free spectrum interval the value of the emission line width, namely approximately 3.3 cm$^{-1}$. It has been observed that the limit thickness is about one millimeter.

c) Between these two extremes (x=1 and x=0.001), it is possible to take x=0.1, namely N=$1.4 \times 10^{21}$ cm$^{-3}$, which gives a thickness of L=0.3 mm.

Such a thin plate may be obtained by polishing. On one of its faces, a film of reflecting gold is deposited designed to act as a mirror with high reflectivity on the wavelength of 1.5335 μm. The rear face of the InGaAsP double heterostructure is lumenized by a film of SiO producing a reflection of less than $10^{-2}$. The assembly according to FIG. 4 is embodied with the aid of thin bondings so as to avoid destroying the parallelism of the surfaces. Cyanoacrylate or epoxy type glues for "IR optics" are perfectly suitable.

What is claimed is:

1. A wavelength-stabilized semiconductor laser comprising a substrate having mounted thereon a semiconductor heterostructure with an active layer, said active layer having a spontaneous emission band, a current source including electrode means connected to said current source, at least one mirror, and a crystal doped with rare earth ions having a transition falling within the spontaneous emission band of said active layer, said crystal being disposed between said mirror and said active layer, the laser transmitting on a wavelength corresponding to the transition of the rare earth ion.

2. Semiconductor laser according to claim 1, wherein the rare earth ions are selected from the group consisting of:
Sm$_{2+}$ for a wavelength of between 0.65 μm and 0.7 μm,
Nd$^{3+}$, Yb$^{3+}$ for a wavelength of between 0.81 μm and 1 μm,
Tm$^{2+}$ for a wavelength of about 1.2 μm,
Er$^{3+}$ for a wavelength of about 1.5 μm,
Tm$^{3+}$, Ho$^{3+}$ for a wavelength of about 2 μm.

3. Semiconductor laser according to claim 1, wherein the crystal is taken from the group consisting of LiYF$_3$, Y$_3$Al$_5$O$_{12}$, LaCl$_3$, LaF$_3$, LaP$_5$O$_{14}$, CaWO$_4$, LiYF$_4$, Na$_5$La(WO$_4$)$_4$, LiLaP$_4$O$_{12}$, KLaP$_4$O$_{12}$.

4. Semiconductor laser according to claim 2, wherein the formula of the doped crystal is LiY$_{1-x}$Er$_x$F$_4$ where x is between 0.001 and 1.

5. Semiconductor laser according to claim 1, wherein the doped crystal has the shape of a thin plate cut from a monocrystal, this thin plate constituting a Fabry-Pérot standard having a thickness less than the value giving this standard a free spectral interval of about the width of the emission line of the rare earth ion.

6. Semiconductor laser according to claim 1, wherein the doped crystal has the shape of a thin plate.

7. Semiconductor laser according to claim 1, wherein the semiconductor heterostructure has one split face and one face covered with a coating, the doped crystal being disposed between the coating and the mirror.

8. Semiconductor laser according to claim 7, wherein the doped crystal is in contact with the coating.

9. Semiconductor laser according to claim 7, wherein the doped crystal is in contact with the mirror.

10. Semiconductor laser according to claim 8, wherein it further includes an optical fiber disposed between the doped crystal and the mirror.

11. Semiconductor laser according to claim 1, including more than one doped crystal each having a different chemical nature, but each containing the same rare earth ions, the laser then being stabilized on several wavelengths.

* * * * *

UNITED STATES PATENT AND TRADEMARK OFFICE
CERTIFICATE OF CORRECTION

PATENT NO. : 5,052,007

DATED : September 24, 1991

INVENTOR(S) : Francois Auzel

It is certified that error appears in the above-identified patent and that said Letters Patent is hereby corrected as shown below:

Title page, "Assignee:" after "Telecommunications", insert --and Space--;

Signed and Sealed this

Fifteenth Day of June, 1993

Attest:

MICHAEL K. KIRK

Attesting Officer

Acting Commissioner of Patents and Trademarks